United States Patent
Jain et al.

(10) Patent No.: US 8,605,480 B2
(45) Date of Patent: Dec. 10, 2013

(54) READ ONLY MEMORY DEVICE WITH COMPLEMENARY BIT LINE PAIR

(75) Inventors: Nitin Jain, Ghaziabad (IN); Piyush Jain, Ghaziabad (IN)

(73) Assignee: STMicroelectronics International N.V., Amsterdam (NL)

( * ) Notice: Subject to any disclaimer, the term of this patent is extended or adjusted under 35 U.S.C. 154(b) by 155 days.

(21) Appl. No.: 13/178,856

(22) Filed: Jul. 8, 2011

(65) Prior Publication Data
US 2012/0163064 A1    Jun. 28, 2012

(30) Foreign Application Priority Data
Dec. 28, 2010    (IN) .......................... 3128/DEL/2010

(51) Int. Cl.
G11C 17/00    (2006.01)

(52) U.S. Cl.
USPC ........................................... 365/104; 365/94

(58) Field of Classification Search
USPC .......................................... 365/104
See application file for complete search history.

(56) References Cited

U.S. PATENT DOCUMENTS

| | | | | |
|---|---|---|---|---|
| 5,586,072 A | * | 12/1996 | Longway et al. | 365/63 |
| 6,282,114 B1 | * | 8/2001 | Hanriat et al. | 365/103 |
| 6,363,001 B1 | * | 3/2002 | Borot et al. | 365/104 |
| 6,850,427 B1 | * | 2/2005 | Prestwich | 365/104 |
| 7,002,827 B1 | * | 2/2006 | Sabharwal et al. | 365/94 |
| 7,057,916 B2 | * | 6/2006 | Ferrant | 365/63 |
| 7,447,074 B2 | * | 11/2008 | Jacquet | 365/185.17 |
| 7,936,578 B2 | * | 5/2011 | Nevers et al. | 365/51 |
| 8,120,939 B2 | * | 2/2012 | Liaw | 365/104 |
| 8,379,468 B2 | * | 2/2013 | Ramaraju et al. | 365/201 |
| 2008/0008019 A1 | * | 1/2008 | Balasuramanian | 365/208 |
| 2011/0211382 A1 | * | 9/2011 | Sharma et al. | 365/104 |

OTHER PUBLICATIONS

Haraszti Tegze P., *Novel Circuits for High Speed ROMs*, IEEE Journal of Solid State Circuits.
Haraszti Tegze P., *A Very High Speed CMOS/SOS Look-up ROM*, ESSCIRC '82, pp. 192-195.

* cited by examiner

*Primary Examiner* — Son Mai
(74) *Attorney, Agent, or Firm* — Wolf, Greenfield & Sacks, P.C.

(57) ABSTRACT

A read only memory cell circuit is provided. The memory cell circuit includes at least one memory cell. A pair of bit lines associated with each memory cell is provided which form a complementary output. The at least one memory cell is configured to be coupled to first or second of the bit line pair.

23 Claims, 7 Drawing Sheets

READ ONLY MEMORY DEVICE WITH COMPLEMENARY BIT LINE PAIR

CROSS REFERENCE TO RELATED APPLICATIONS

This application claims the priority benefit of Indian patent application number 3128/Del/2010, filed on Dec. 28, 2010, entitled MEMORY DEVICE, which is hereby incorporated by reference to the maximum extent allowable by law.

BACKGROUND OF THE INVENTION

1. Field of the Invention

The present invention relates to read only memory devices, for example, but not exclusively to read only memory devices in integrated circuits.

2. Discussion of the Related Art

Memory devices are commonly employed as internal storage areas in computer or processors or other types of electronic equipment.

One of the types of memory devices commonly employed as internal storage is non-volatile semiconductor data storage memory devices such as those commonly referred to as read only memory (ROM). The read only memory device is typically designed to store data in a read only memory array of memory cells. Each memory cell has typically a single transistor per bit of storage. The memory device is characterized in that the ROM is typically hardware pre-programmed during the integrated circuit fabrication process and capable of maintaining the stored data indefinitely and even in the absence of power (as compared against volatile memory such as random access memory (RAM)). Read only memory can be included in any type of integrated circuit such as for example as a read only memory integrated circuit, or as part of a substantial circuit such as an embedded read only memory component within a processor or digital signal processor, controller, or telecommunications integrated circuit. In general the read only memory is used to hold and make available data or code which will not be altered after manufacture.

Typically read only memory arrays of memory cells are defined by a number of transistors arranged in a grid pattern having a plurality of rows and columns. As shown in FIG. 2, each individual transistor of each memory cell of the read only memory is placed between a column of the series of columns and a voltage bus. The column is supplied with power at a first predetermined voltage level referred to as the pre-charged voltage level and the voltage bus is supplied with power at a second different predetermined voltage level. In order to obtain information from the read only memory, a row of memory cells can be activated and all transistors along that row are activated via their respective gates. Along the activated row all the transistors which have been programmed to a "0" data state move their respective columns towards the source voltage bus potential whereas all transistors that have been programmed to a "1" data state will not change their voltage of their associated columns. This can be achieved in some conventional read only memory devices by making or breaking the to coupling between the transistor drain and the associated bit line, while maintaining the coupling of the transistor source to a low source potential and the gate coupled to the transistor associated word line. Thus, as shown in FIG. 2, a transistor, such as transistor 151, programmed with a value of "0" has the coupling between the transistor drain and the bit line 'made' and a transistor, such as transistor 161, programmed with a value of "1" has the coupling between the transistor and the bit line broken (or never made or fabricated). The column voltages or voltage levels are sensed from selective columns or bit lines.

Conventional ROM devices although efficient in terms of device components are problematic in many ways.

Firstly, the use a single bit line per bit may require the use of an unbalanced sense amplifier. The high offset required by an unbalanced sense amplifier in turn produces a read only memory design which suffers from both speed and dynamic power issues. The unbalanced differential sensing read only memory suffers from a speed of penalty because of the large bit line discharge required to meet the high offset of the unbalanced sensor amplifier.

Secondly, a conventional read only memory design can also suffer from a high static power loss due to high leakage from the read only memory core array. Furthermore there is a large variation of leakage dependent on the bit line discharge under the varying leakage condition and the large variation of bit line discharge and a device mismatch effects on each read only memory bit cell.

Thirdly the unbalanced differential sensing requires high offset conditions because of the varying process, voltage and temperature conditions which can be employed in the read only memory.

SUMMARY OF THE INVENTION

It is an aim of embodiments of the present application to overcome these problems by applying differential bit lines for each read only memory cell.

According to a first aspect, there is provided a read only memory cell circuit comprising: at least one memory cell; a pair of bit lines associated with each memory cell, wherein the pair of bit lines form a complementary output, and wherein the at least one memory cell is configured to be coupled to first or second of the bit line pair.

The memory cell may comprise an nmos transistor, and the nmos transistor may comprise: a gate coupled to an associated word line of the read only memory; and a drain coupled to the first bit line of the bit line pair to represent a first stored bit value.

The memory cell may comprise an nmos transistor, and the nmos transistor may comprise: a gate coupled to an associated word line of the read only memory; and a drain coupled to the second bit line of the bit line pair to represent a second stored bit value.

The nmos transistor may comprise a source coupled to a low reference voltage.

The read only memory cell circuit may further comprise a memory cell multiplex line associated with each memory cell configured to be selectively coupled to a low reference voltage, wherein the nmos transistor comprises a source coupled to the associated memory cell multiplex line.

The memory cell may comprise a pmos transistor, and the pmos transistor comprises: a gate coupled to an associated word line of the read only memory; and a drain coupled to the first bit line of the bit line pair to represent a first stored bit value.

The memory cell may comprise a pmos transistor, and the pmos transistor comprises: a gate coupled to an associated word line of the read only memory; and a drain coupled to the second bit line of the bit line pair to represent a second stored bit value.

The pmos transistor may comprise a source coupled to a high reference voltage. The read only memory cell circuit may further comprise a memory cell multiplex line associated with each memory cell configured to be selectively coupled to a low reference voltage, wherein the pmos transistor comprises a source coupled to the associated memory cell multiplex line.

A read only memory slice circuit may comprise at least two read only memory cell circuits as described herein, wherein the first memory cell second bit line may be the second memory cell's first bit line, and the memory slice circuit may further comprise a switch configured to selectively output one of: the first memory cell second bit line output to a first input of a memory slice sense amplifier; and the second cell first bit line output to a second input of the memory slice sense amplifier.

A read only memory circuit may comprise at least two memory slice circuits as described herein, wherein the first memory slice last memory cell second bit line may be the second memory slice first memory cell first bit line, and the read only memory circuit may further comprise a slice switch configured to selectively output one of: the first slice last memory cell second bit line output to a first input of a first memory slice sense amplifier; and the second slice first memory cell first bit line output to a second input of a second memory slice sense amplifier.

A memory device may comprise a read only memory as described herein.

According to a second aspect, there is provided a method comprising: associating a pair of bit lines with each of at least one memory cell, wherein the pair of bit lines form a complementary output; and coupling the at least one memory cell to a first or second bit line of the bit line pair.

The method may further comprise providing an nmos transistor, wherein providing the nmos transistor may comprise: coupling an nmos transistor gate to an associated word line of the read only memory; and coupling an nmos transistor drain to the first bit line of the bit line pair to represent a first stored bit value.

The method may further comprise providing an nmos transistor, wherein providing the nmos transistor may comprise coupling an nmos transistor gate to an associated word line of the read only memory; and coupling an nmos transistor drain to the second bit line of the bit line pair to represent a second stored bit value.

Providing the nmos transistor may comprise coupling an nmos transistor source to a low reference voltage.

The method may further comprise: associating a memory cell multiplex line with each memory cell; coupling the memory cell multiplex line to a low reference voltage; and wherein providing the nmos transistor comprises coupling an nmos transistor source to the associated memory cell multiplex line.

The method may further comprise providing a pmos transistor, wherein providing the pmos transistor may comprise: coupling a pmos transistor gate to an associated word line of the read only memory; and coupling a pmos transistor drain to the first bit line of the bit line pair to represent a first stored bit value.

The method may further comprise providing a pmos transistor, wherein providing the pmos transistor may comprise coupling a pmos transistor gate to an associated word line of the read only memory; and coupling a pmos transistor drain to the second bit line of the bit line pair to represent a second stored bit value.

Providing the pmos transistor may comprise coupling a pmos transistor source to a high reference voltage.

The method may further comprise: associating a memory cell multiplex line with each memory cell; coupling the memory cell multiplex line to a high reference voltage; and wherein providing the pmos transistor comprises coupling a pmos transistor source to the associated memory cell multiplex line.

The method may further comprise: sharing a first memory cell second bit line and a second memory cell first bit line in a memory slice; and selectively outputting one of: the first memory cell second bit line output to a first input of a memory slice sense amplifier; and the second cell first bit line output to a second input of the memory slice sense amplifier.

The method may further comprise: sharing a first memory slice last memory cell second bit line and a second memory slice first memory cell first bit line; and selectively outputting one of: the first slice last memory cell second bit line output to a first input of a first memory slice sense amplifier; and the second slice first memory cell first bit line output to a second input of a second memory slice sense amplifier.

According to a third aspect there is provided read only memory apparatus comprising: means for associating a pair of bit lines with each of at least one memory cell, wherein the pair of bit lines form a complementary output; and means for coupling the at least one memory cell to a first or second bit line of the bit line pair.

The memory cell may comprise an nmos transistor, and the nmos transistor may comprise: a gate coupled to an associated word line of the read only memory; and a drain coupled to the first bit line of the bit line pair to represent a first stored bit value.

The memory cell may comprise an nmos transistor, and the nmos transistor may comprise: a gate coupled to an associated word line of the read only memory; and a drain coupled to the second bit line of the bit line pair to represent a second stored bit value.

The nmos transistor may comprise a source coupled to a low reference voltage.

The read only memory cell circuit may further comprise a memory cell multiplex line associated with each memory cell configured to be selectively coupled to a low reference voltage, wherein the nmos transistor comprises a source coupled to the associated memory cell multiplex line.

The memory cell may comprise a pmos transistor, and the pmos transistor comprises: a gate coupled to an associated word line of the read only memory; and a drain coupled to the first bit line of the bit line pair to represent a first stored bit value.

The memory cell may comprise a pmos transistor, and the pmos transistor comprises: a gate coupled to an associated word line of the read only memory; and a drain coupled to the second bit line of the bit line pair to represent a second stored bit value.

The pmos transistor may comprise a source coupled to a high reference voltage.

The read only memory cell circuit may further comprise a memory cell multiplex line associated with each memory cell configured to be selectively coupled to a low reference voltage, wherein the pmos transistor comprises a source coupled to the associated memory cell multiplex line.

A read only memory slice circuit may comprise at least two read only memory cell circuits as described herein, wherein the first memory cell second bit line may be the second memory cell's first hit line, and the memory slice circuit may further comprise a switch configured to selectively output one of: the first memory cell second bit line output to a first input of a memory slice sense amplifier; and the second cell first bit line output to a second input of the memory slice sense amplifier.

A read only memory circuit may comprise at least two memory slice circuits as described herein, wherein the first memory slice last memory cell second bit line may be the second memory slice first memory cell first bit line, and the read only memory circuit may further comprise a slice switch configured to selectively output one of: the first slice last memory cell second bit line output to a first input of a first memory slice sense amplifier; and the second slice first memory cell first bit line output to a second input of a second memory slice sense amplifier.

BRIEF DESCRIPTION OF THE DRAWINGS

Reference will be made by way of example only to the accompanying drawings in which.

DETAILED DESCRIPTION

This document describes apparatus and methods for operating a complementary bit line read only memory cell architecture. The embodiments of the application aim to produce an improvement over at least some of the conventional approaches.

Figure 1:
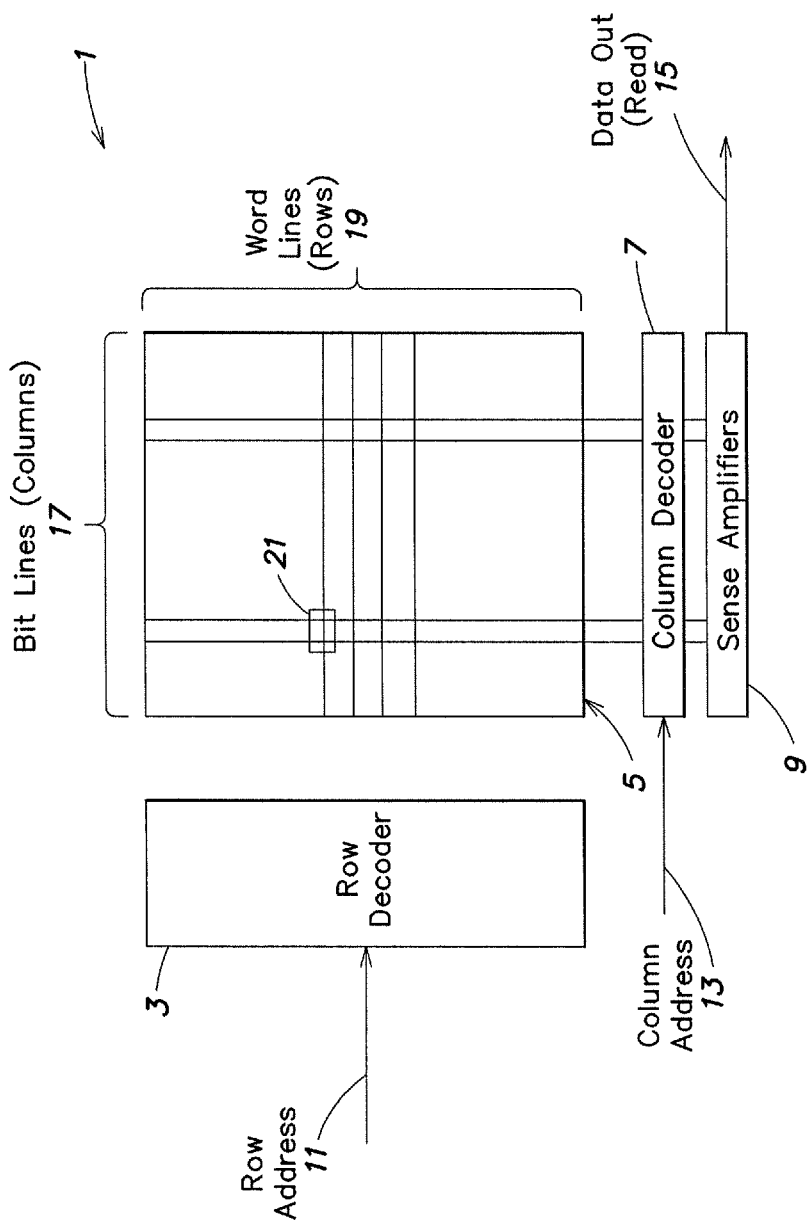
FIG. 1 shows schematically a read only memory architecture suitable for implementing in embodiments of the application.

FIG. 1 shows schematically a block diagram of a read only memory device 1 suitable for implementing embodiments of the application. As shown in FIG. 1, the device 1 is defined using bit lines (or columns) 17 and word lines (or rows) 19. Any given bit can be randomly accessed for a read operation by inputting the coordinates, in other words the address of the bit into the memory cell array 5. To read one bit of the data stored in the read only memory cell array a row address 11 can be input to and decoded by a row decoder 3 to select one of the rows or word lines 19 which run through the memory cell array 5 and is configured to select memory cells 21 within the memory cell array. The selection of one of the word lines or rows 19 can, in some embodiments, activate all of the memory cells 21 along the selected row.

In some embodiments, the memory array comprises a column decoder 7 configured to receive a column address 13 for selecting or selectively outputting the data stored on the bit lines or columns 17 output by the activated memory cell 21 associated with the bit lines or columns 17 to a sense amplifier 9 configured to determine the values stored on the bit lines or column 17 and output these values as data 15. In embodiments of the application, for each memory cell 21 there are a pair of complementary bit lines or columns 17. The complementary bit lines per cell are configured in such a way that for each of the memory cells where a value is entered on one of the bit lines per memory cell the complementary value is entered on the complementary bit line. Thus, in embodiments of the application, the sense amplifier can be a balanced or differential sense amplifier configured to output data based on the differential input supplied by the pair of complementary bit lines per column.

The configuration or operation of the row decoder, column decoder and differential sense amplifier are generally known and are not discussed in further detail.

Figure 3:
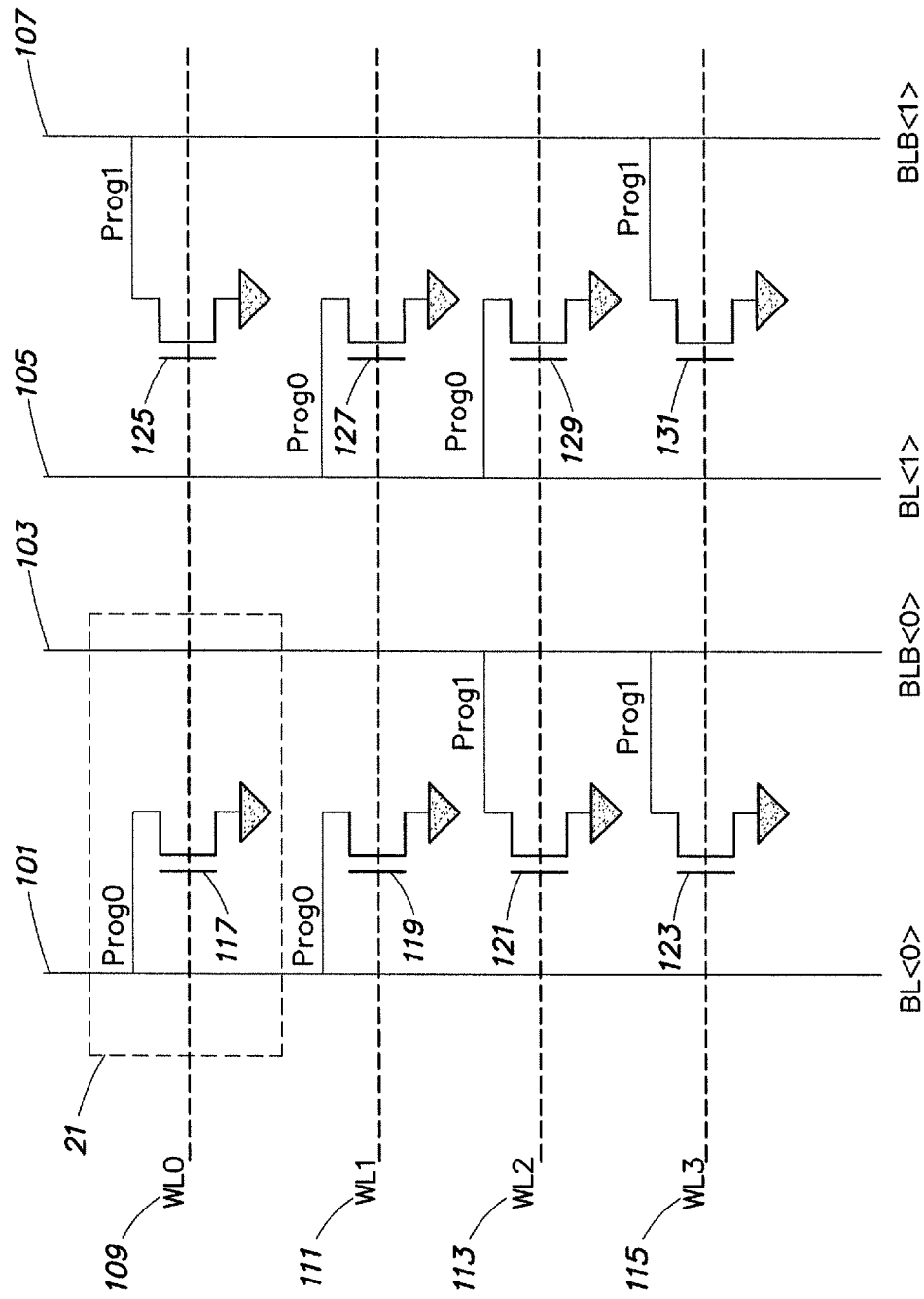
FIG. 3 shows schematically a memory cell architecture according to some embodiments of the application.

With respect to FIG. 3, a schematic view of a series of memory cells 21 are shown in further detail with respect to some embodiments of the application. The example shown in FIG. 3 shows a read only memory configuration according to embodiments of the application comprising eight memory cells 21. These memory cells 21 are arranged in a "two column-four row" configuration—in other words, in a 4×2 bit layout. It will be understood, however, that the memory cell array 5 is, for example, only and can be any suitable configuration. Each of the rows of memory cells 21 can be coupled to a row or word line. Thus, the example shown in FIG. 3 has four word lines, a first word line WL0 109, a second word line WL1 111, a third word line WL2 113, and a fourth word line WL3 115. Furthermore each column of memory cells 21 are coupled to a bit line pair comprising a first bit line BL<X> and a complementary bit line BLB<X> where X represents the memory cell column index. The example shown in FIG. 3 has two columns of memory cells 21 and shows a first bit line pair BL<0> 101 with an associated first complementary bit line BLB<0> 103 and a second bit line BL<1> 105 and a second complementary bit line BLB<1> 107.

Each memory cell 21 comprises an nmos transistor with a source node coupled to the low voltage reference, a gate node coupled to the word line associated with the memory cell row, and a drain coupled to either the bit line BL or complementary bit line BLB associated with the memory cell column. In some embodiments it is configured that during fabrication the read only memory can be programmed such that if a bit value is to be a first bit value (a "0" value) the drain of the transistor is coupled to the bit line associated with the memory cell column, whereas if the memory cell is to be programmed with a second value (a "1" value) the drain of the transistor is coupled to the complementary bit line associated with the memory cell column.

Thus, as shown in FIG. 3, a first transistor 117 located on the first row and first column is programmed with a "0" value by the first transistor drain being coupled to the first bit line BL<0> 101, a second transistor 119 located on the second row and first column is programmed with a "0" value by the second transistor drain being coupled to the first bit line BL<0> 101, a third transistor 121 located on the third row and first column is programmed with a "1" value by the third transistor drain being coupled to the first complementary bit line BLB<0> 103, and the fourth transistor located on the fourth row and first column is programmed with a "1" value by the fourth transistor drain being coupled to the first complementary bit line BLB<0> 103.

Similarly, the second column shown in FIG. 3 shows a fifth transistor 125 located on the first row and second column being programmed with a "1" value by the fifth transistor drain coupled to the second complementary bit line BLB<1> 107, a sixth transistor 127 located on the second row and second column being programmed with a "0" value by the sixth transistor drain coupled to the second bit line BL<1> 105, a seventh transistor 129 located on the third row and second column being programmed with a "0" value by the seventh transistor to drain coupled to the second bit line BL<1> 105, and the eighth transistor located on the fourth row and second column being programmed with a "1" value by the eighth transistor drain coupled to the second complementary bit line BLB<1> 107.

Thus, in embodiments as described herein, when attempting to read a memory cell programmed with a value of "0," the activation of the transistor couples the bit line to the low reference voltage discharging the bit line but maintaining the charge on the complementary bit line. Furthermore, similarly, a memory cell programmed with a value of "1," when activated, couples the complementary bit line to the low reference voltage and thus discharging the complementary bit line of the bit line pair to but maintains the charge in the bit line of each bit line pair.

Therefore, on selection or passing of the bit line pair charge values in such embodiments the sense amplifier 9 can be implemented as any suitable complementary or balanced sense amplifier configuration such, as for example, a pair of cross coupled inverters operating as a differential balanced sense amplifier.

Figure 4:
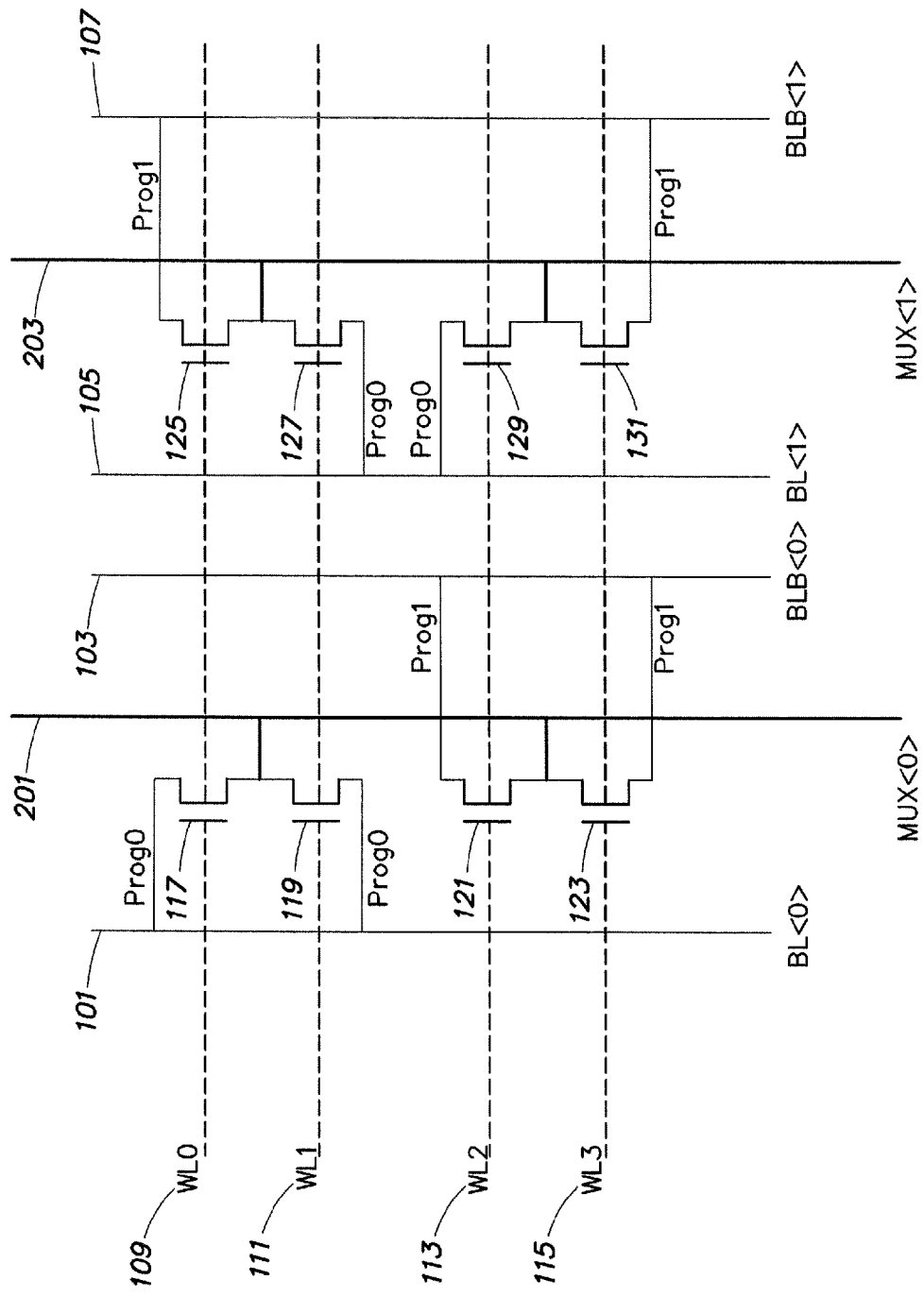
FIG. 4 shows schematically a second memory cell architecture according to some embodiments of the application.

With respect to FIG. 4, a schematic view of a second memory cell architecture according to some embodiments of the application are shown. In the example shown in FIG. 4 the architecture differs from that shown in FIG. 3 in that each column of memory cells is provided with a column multiplex line MUX<X> where X is associated with the column number and routed through each memory cell column. The column multiplex line MUX<X> is furthermore in such embodiments further coupled to the source of each transistor in the associated column. The column multiplex line is configured to be selectively coupled to either a low reference voltage (such as GND) or a high reference voltage (VDD).

For example, as shown in FIG. 4, the first column of memory cells comprising the first transistor 117, second transistor 119, third transistor 121, and fourth transistor 123 are configured to have their associated source nodes coupled to the first column multiplex column line MUX<0> 201. The second column of memory cells similarly comprising the fifth transistor 125, sixth transistor 127, seventh transistor 129 and eighth transistor 131, in these embodiments, are configured to have their associated source nodes coupled to the second column multiplex line MUX<1> 203.

It can be seen from FIG. 4 that the transistors themselves are programmed in a manner similar to that shown in the embodiments with regard to FIG. 3 in that a programming of a first value (such as "0") couples the drain of the memory cell transistor to the associated column bit line and a programming of a second value (such as "1") couples the drain of the memory cell transistor to the associated column complementary bit line.

In these embodiments, the column multiplex lines are configured to be coupled to the high reference voltage while the memory device is in an idle state and couple the selected column multiplex line to the low reference voltage during the read state. Thus, in some embodiments, the column multiplex line can be controlled by the column decoder 7 in such a manner that when the column decoder is activated by the column address the column decoder is configured to couple the selected column multiplex line or lines to the low reference voltage prior to selectively outputting the bit lines to the sense amplifier.

In such embodiments, not only can the use of balanced sense amplifiers be used for sensing, but there is a significant leakage reduction achieved by supplying the low reference voltage to the read only memory cells through the column multiplex lines and thus reducing the memory core standby leakage to close to 0. Furthermore, as only the bit line corresponding to the selected column multiplex line is coupled only this bit line will discharge and therefore charge injection because of bit line to bit line coupling can be avoided as well as heavily reducing the dynamic power as non-selected bit lines do not discharge.

Figure 5:
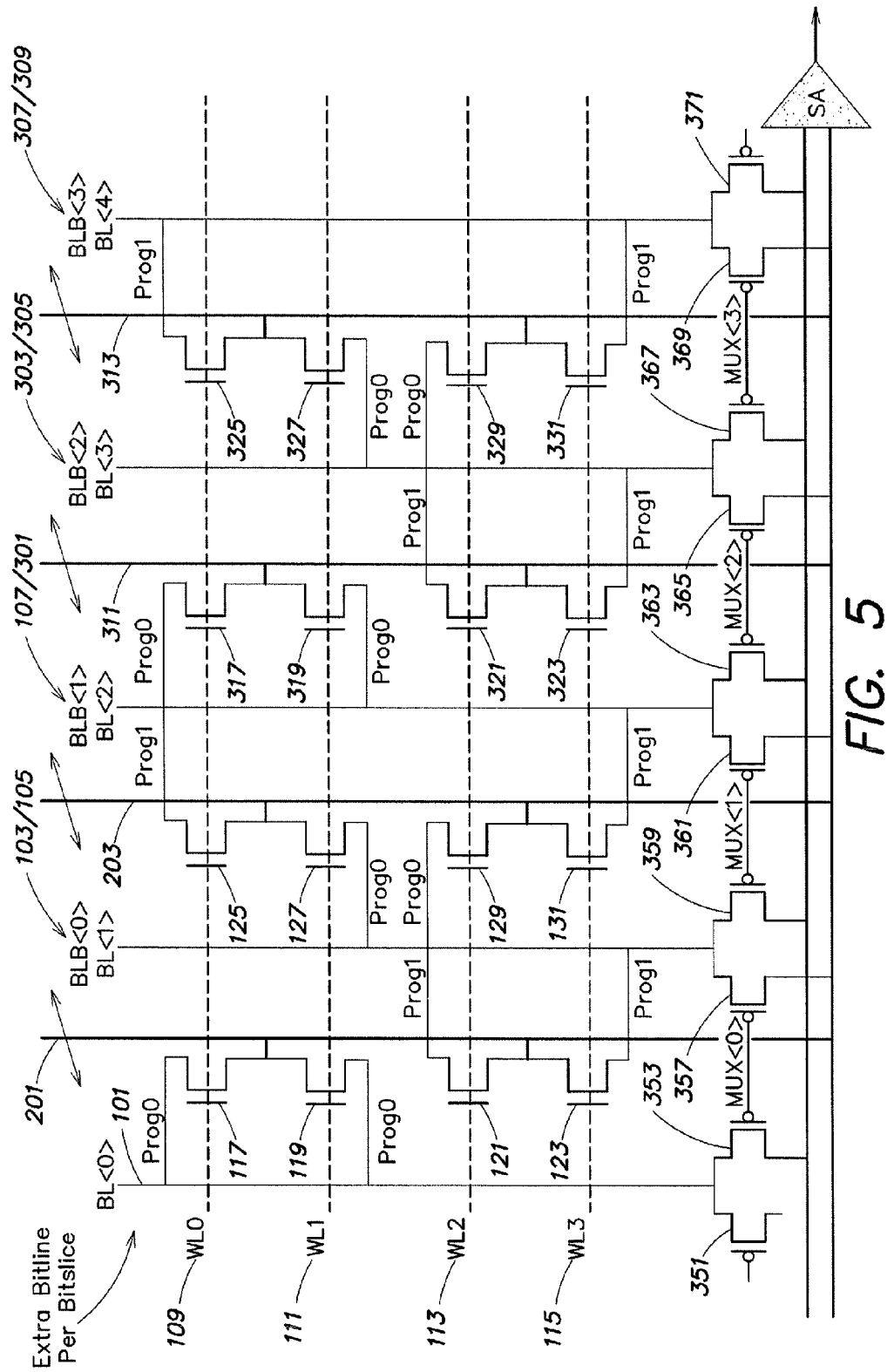
FIG. 5 shows schematically a third memory cell architecture according to some embodiments of the application.

With respect to FIG. 5, a third architecture for memory cells according to some embodiments of the application is shown. In the example shown in FIG. 5, a sixteen memory cell 21 configuration, including memory cells 117, 119, 121, 123, 125, 127, 129, 131, 317, 319, 321, 323, 325, 327, 329 and 331, is shown where there is a 4×4 memory cell arrangement. In other words, there are four rows and four columns of memory cells. In the embodiments of the application shown in FIG. 5, the configuration of each memory cell is similar to that shown in FIG. 4, in that each column of memory cells is coupled via the memory cell transistor source nodes to a column multiplex line and programming of each memory cell 21 of a first value (such as "0") couples the drain of the memory cell transistor to the associated column bit line and a programming of a second value (such as "1") couples the drain of the memory cell transistor to the associated column complementary bit line.

In some embodiments, each column of memory cells can be configured to reuse bit lines between adjacent memory cells. In other words, a first column of memory cells 21 can comprise a bit line BL<0> 101 and a complementary bit line BLB<0> 103, as shown with respect to the embodiments shown in FIGS. 3 and 4. In such embodiments, the second column of memory cells (adjacent to the first column of memory cells) comprises a second column bit line BL<1> which can be a re-used first column complementary bit line BLB<0> and a second column complementary bit line BLB<1>. In other words, a bit line (e.g., bit lines 103/105, 107/301, 303/305 and 307/309 shown in FIG. 5) can be configured in some embodiments for the first to the penultimate column for each bit line slice to be the bit line for a column of memory cells and the complementary bit line for the previous or preceding column of memory cells.

In such embodiments, each shared bit line/complementary bit line can be configured to be coupled to either a first input for a sense amplifier (as the shared bit line/complementary bit line is configured to operate as the bit line) by a first pass gate transistor or be coupled to a second input for the sense amplifier (as the shared the bit line/complementary bit line bit line/complementary bit line is configured to operate as the complementary bit line) by a second pass gate transistor. It would be appreciated that any other suitable switch configuration can be employed in some other embodiments.

In some embodiments, the transistors of the pass gate transistors (e.g., 351, 353, 357, 359, 361, 363, 365, 367, 369 and 371 shown in FIG. 5) are pmos transistors and coupled via their gate nodes to the column multiplex line (e.g., lines 201, 203, 311 and 313 shown in FIG. 5) such that when the column is coupled to the low reference voltage, in other words selecting the column, the pass transistor for the selected column of memory cells is activated passing the charge of the shared bit line of the selected column to the sense amplifier.

Thus, in these embodiments, a differential read operation is possible with sharing of bit lines extended across the whole of the column slice thus significantly reducing the average number of bit lines per column required and thus reducing the area penalty.

Furthermore, data programmed from the shared column on any common bit line does not interfere with the selected column read as the multiplex select line of the next column is not selected and thus the transistors in adjacent columns are not activated. Thus, the maximum bit line discharge in such embodiments is limited to $V_{DD}-V_T$.

Figure 6A:
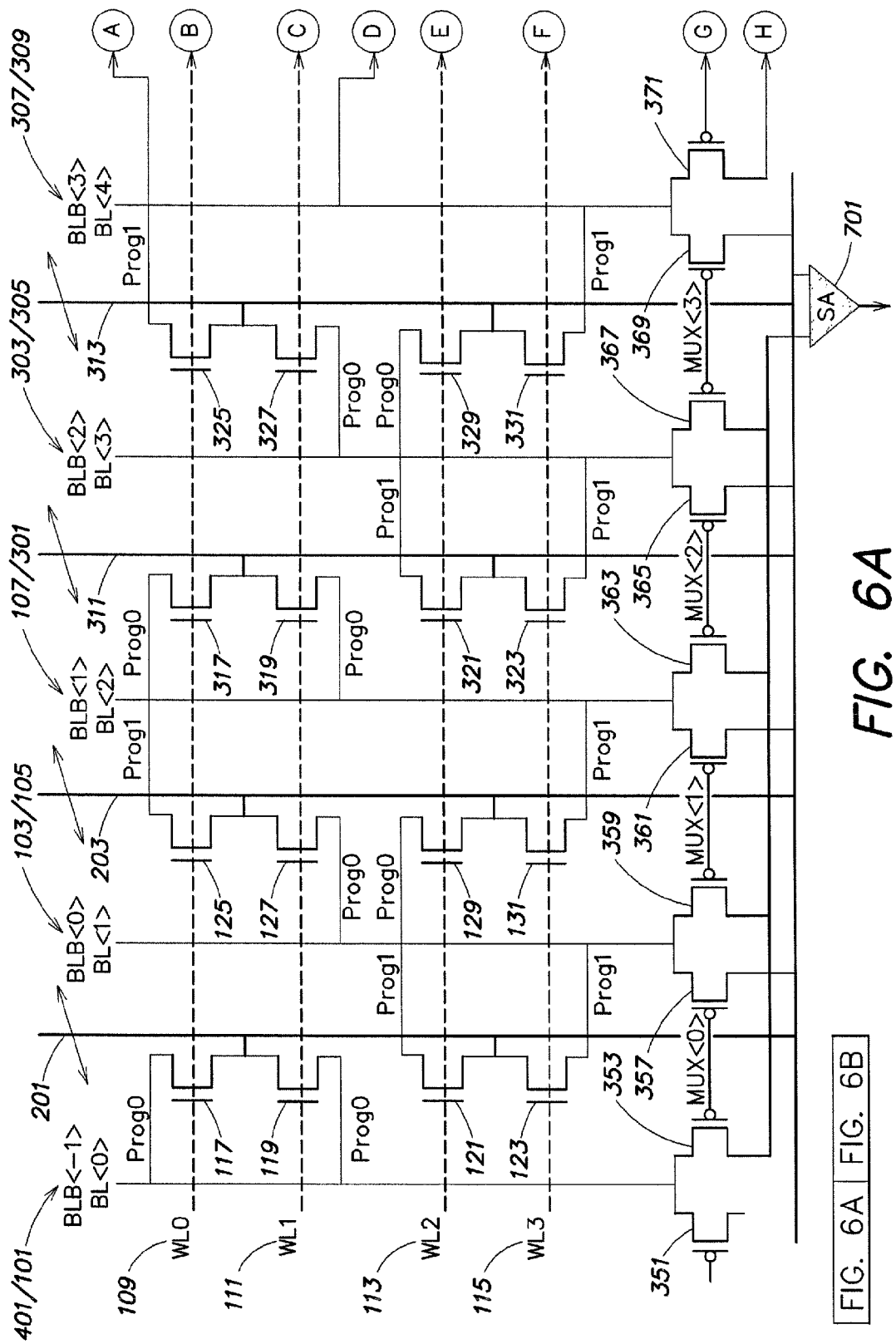
FIGS. 6A and 6B show schematically a fourth memory cell architecture according to some embodiments of the application.
Figure 6B:
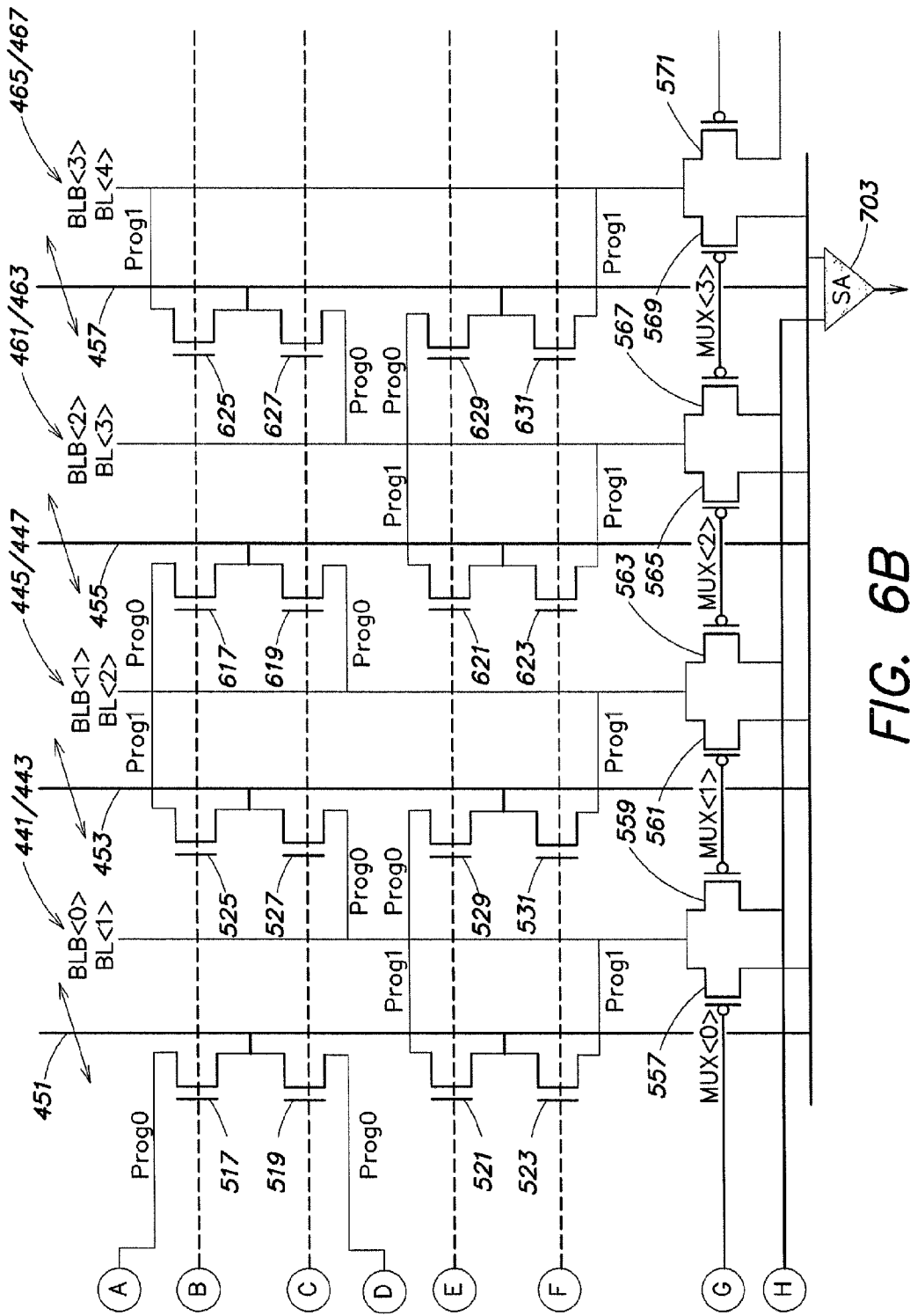

With respect to FIGS. 6A and 6B, a 4×8 configuration of memory cells 21, including memory cells 117, 119, 121, 123, 125, 127, 129, 131, 317, 319, 321, 323, 325, 327, 329, 331, 517, 519, 521, 523, 525, 527, 529, 531, 617, 619, 621, 623, 625, 627, 629 and 631, is shown according to some embodiments of the application. In the embodiments shown in FIGS.

Figure 2:
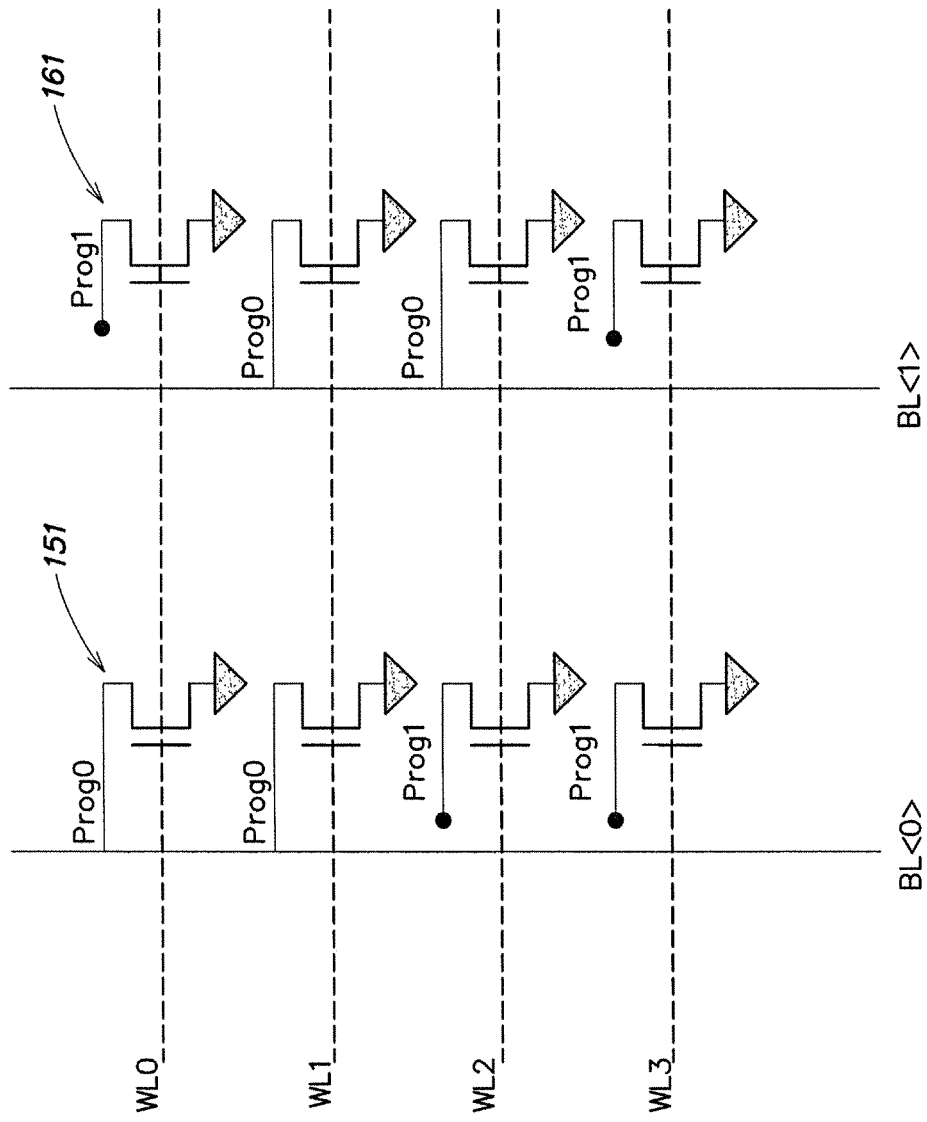
FIG. 2 shows schematically conventional read only memory cell architecture.

6A and 6B, the shared bit line embodiment shown in FIG. 5 is developed by sharing the bit lines and complementary bit lines across bit slices, as shown by bit lines 401/101, 103/105, 107/301, 303/305 and 307/309 in FIG. 6A and bit lines 441/443, 445/447, 461/463 and 465/467 in FIG. 6B. In other words, as shown in FIGS. 6A and 6B, 2 bit line slices of 4×4 memory cells are shown, each similar to the 4×4 memory cell configuration shown in FIG. 5. However, the complementary bit line for the fourth column BLB<3> 307 of the first bit slice 701 is shared with the first bit line of the first column BL<0> of the second bit line slice 703.

The shared complementary bit line for the fourth column BLB<3> 307 of the first bit slice 701 and first bit line of the first column BL<0> of the second bit line slice 703 can be configured to be coupled to either a first input for a first slice sense amplifier (as the shared bit line/complementary bit line is configured to operate as the complementary bit line for the first slice) by a first pass gate transistor or be coupled to a second input for a second sense amplifier (as the shared bit line/complementary bit line is configured to operate as the bit line for the second slice) by a second pass gate transistor. It will be appreciated that any other suitable switch configuration can be employed in other embodiments. This configuration further reduces the area penalty by effectively having only one extra bitline for the whole core array.

In such bit slice sharing embodiments the transistors of the pass gate transistors (e.g., 351, 353, 357, 359, 361, 363, 365, 367, 369 and 371 shown in FIGS. 6A and 557, 559, 561, 563, 565, 567, 569, and 571 shown in FIG. 6B) are pmos transistors and coupled via their gate nodes to an associated column multiplex line (e.g., lines 201, 203, 311, 313, 451, 453, 455, and 457 shown in FIGS. 6A and 6B) such that when the column is coupled to the low reference voltage, in other words selecting the column, the pass transistor for the selected column of memory cells is activated passing the charge of the shared bit line of the selected column to the first bit slice sense amplifier or the second bit slice sense amplifier.

In some embodiments, a large variation of programming load on bitlines can thus be limited to between 0.5 row to 1.5 rows by reversing the programming of bit cells in a column depending upon the programming pattern in previous columns and correspondingly swapping the connection of the multiplex pass gate to the sense amplifier inputs.

Thus, if the number of programmable contacts on a bit line from any column is more than 50%, than the programming on successive columns can be done in such a way that less than or equal to 50% programming contacts fall on the same bit line.

Furthermore, any unequal noise injection from the multiplex select line on the selected bit line pair can be compensated for by slightly delaying the precharge off and word line on switching with respect to the column multiplex line discharge. Also the unequal leakage on bit lines due to unequal number of programmed cells gets compensated for to at least some extent in some embodiments due to increased programming load on bit lines with a higher number of leaky cells.

In some embodiments, a code dependent column inversion can be performed without introducing a logic delay penalty as the differential sense amplifier without any imbalance can be used to sense the complementary bitlines.

In another embodiment, nmos size (width) of ROM bitcell can be enlarged to the extent allowed by the metal dominated layout pattern of above described ROM array configuration. The increased device size of nmos increases the speed drastically because of increased ION and reduced statistical spread of ION.

In some embodiments, a large programmable load on complementary bit-lines may be avoided by reversing a programmable pattern of memory cells of a column based on a pattern of memory cells of the preceding column. For example, the programmable contacts on a bit line may be reversed such that a shared bit line is a complement bit line for a first and a second memory slice. In this case, the switch for the sense amplifier will also be reversed to reflect the reversal of a bit and complement bit line for a column. The reversal of the programmable load may reduce differential leakage of the bit lines.

Although in the above examples the memory cells are nmos transistors configured with drain coupled to one or other of the bit lines and with sources coupled to a low voltage directly or via a multiplexer line associated with the memory cell column, it would be appreciated that, in some embodiments, the memory cells are pmos transistors configured with sources coupled to one or other of the bit lines and drains coupled to high voltage supplies either directly or via a multiplexer line.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this application can be implemented by computer software executable by a data processor, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

As used in this application, the term 'circuitry' can refer to hardware-only circuit implementations (such as implementations in only analog and/or digital circuitry) and to combinations of circuits and software (and/or firmware), such as: to a combination of processor(s) or (ii) to portions of processor(s)/software (including digital signal processor(s)), software, and memory(ies) that work together to cause an apparatus, such as a mobile phone or server, to perform various functions and to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware.

Whilst this detailed description has set forth some embodiments of the present invention, the appended claims cover other embodiments of the present application which differ from the described embodiments according to various modifications and improvements. Other applications and configurations may be apparent to the person skilled in the art.

What is claimed is:

1. A read only memory cell circuit comprising;
    at least one memory cell;
    a pair of bit lines associated with each memory cell, wherein the pair of bit lines form a complementary output, and wherein the at least one memory cell is configured to be coupled to a first bit line or a second bit line of the bit line pair; and
    a memory cell multiplex line associated with each memory cell configured to be selectively coupled to a low reference voltage or a high reference voltage, wherein the at least one memory cell comprises a source coupled to the associated memory cell multiplex line.

2. The read only memory cell circuit as claimed in claim 1, wherein the memory cell comprises an nmos transistor, and the nmos transistor comprises: a gate coupled to an associated word line of the read only memory; and a drain coupled to the first bit line of the bit line pair to represent a first stored bit value.

3. The read only memory cell circuit as claimed in claim 1, wherein the memory cell comprises an nmos transistor, and the nmos transistor comprises: a gate coupled to an associated word line of the read only memory; and a drain coupled to the second bit line of the bit line pair to represent a second stored bit value.

4. The read only memory cell circuit as claimed in claim 2, wherein the nmos transistor comprises a source coupled to a low reference voltage.

5. The read only memory cell circuit as claimed in claim 1, wherein the memory cell comprises a pmos transistor, and the pmos transistor comprises: a gate coupled to an associated word line of the read only memory; and a drain coupled to the first bit line of the bit line pair to represent a first stored bit value.

6. The read only memory cell circuit as claimed in claim 1, wherein the memory cell comprises a pmos transistor, and the pmos transistor comprises: a gate coupled to an associated word line of the read only memory; and a drain coupled to the second bit line of the bit line pair to represent a second stored bit value.

7. The read only memory cell circuit as claimed in claim 5, wherein the pmos transistor comprises a source coupled to a high reference voltage.

8. The read only memory cell circuit as claimed in claim 5, further comprising a memory cell multiplex line associated with each memory cell configured to be selectively coupled to a low reference voltage, wherein the pmos transistor comprises a source coupled to the associated memory cell multiplex line.

9. A read only memory slice circuit comprising at least two read only memory cell circuits as claimed in claim 8, wherein the first memory cell second bit line is the second memory cell's first bit line, and the memory slice circuit further comprises a switch configured to selectively output one of: the first memory cell second bit line output to a first input of a memory slice sense amplifier; and the second cell first bit line output to a second input of the memory slice sense amplifier.

10. A read only memory circuit comprising at least two memory slice circuits as claimed in claim 9, wherein the first memory slice last memory cell second bit line is the second memory slice first memory cell first bit line, and the read only memory circuit further comprises a slice switch configured to selectively output one of: the first slice last memory cell second bit line output to a first input of a first memory slice sense amplifier; and the second slice first memory cell first bit line output to a second input of a second memory slice sense amplifier.

11. A method comprising:
    associating a pair of bit lines with each of at least one memory cell, wherein the pair of bit lines form a complementary output; and
    coupling the at least one memory cell to a first bit line or a second bit line of the bit line pair;
    associating a memory cell multiplex line with each memory cell;
    coupling the memory cell multiplex line to a low reference voltage or a high reference voltage; and
    coupling a source of the memory cell to the associated memory cell multiplex line.

12. The method as claimed in claim 11, wherein:
    the at least one memory cell comprises an nmos transistor; and the method further comprises:
        coupling an nmos transistor gate to an associated word line of a read only memory; and
        coupling an nmos transistor drain to the first bit line of the bit line pair to represent a first stored bit value.

13. The method as claimed in claim 11, wherein:
    the at least one memory cell comprises an nmos transistor; and the method further comprises:
        coupling an nmos transistor gate to an associated word line of a read only memory; and
        coupling an nmos transistor drain to the second bit line of the bit line pair to represent a second stored bit value.

14. The method as claimed in claim 12, further comprising:
    coupling an nmos transistor source to a low reference voltage.

15. The method as claimed in claim 12, wherein:
    coupling the memory cell multiplex line to a low reference voltage or a high reference voltage comprises coupling the memory cell multiplex line to a low reference voltage; and
    the method further comprises coupling an nmos transistor source to the associated memory cell multiplex line.

16. The method as claimed in claim 11, wherein:
    the at least one memory cell comprises a pmos transistor; and the method further comprises:
        coupling a pmos transistor gate to an associated word line of the read only memory; and
        coupling a pmos transistor drain to the first bit line of the bit line pair to represent a first stored bit value.

17. The method as claimed in claim 11, wherein:
    the at least one memory cell comprises a pmos transistor; and the method further comprises:
        coupling a pmos transistor gate to an associated word line of the read only memory; and
        coupling a pmos transistor drain to the second bit line of the bit line pair to represent a second stored bit value.

18. The method as claimed in claim 16, further comprising: coupling a pmos transistor source to a high reference voltage.

19. The method as claimed in claim 16, wherein:
coupling the memory cell multiplex line to a low reference voltage or a high reference voltage comprises coupling the memory cell multiplex line to a high reference voltage; and
the method further comprises coupling an pmos transistor source to the associated memory cell multiplex line.

20. The method as claimed in claim 11 further comprising: sharing a first memory cell second bit line and a second memory cell first bit line in a memory slice; and selectively outputting one of: the first memory cell second bit line output to a first input of a memory slice sense amplifier; and the second cell first bit line output to a second input of the memory slice sense amplifier.

21. The method as claimed in claim 20, further comprising: sharing a first memory slice last memory cell second bit line and a second memory slice first memory cell first bit line; and selectively outputting one of: the first slice last memory cell second bit line output to a first input of a first memory slice sense amplifier; and the second slice first memory cell first bit line output to a second input of a second memory slice sense amplifier.

22. A memory device comprising a read only memory as claimed in claim 1.

23. A read only memory cell circuit comprising:
a plurality of memory cells arranged in rows and columns; wherein:
a first memory cell of the plurality of memory cells in a first column of the columns is coupled to a first bit line pair comprising a first bit line and a first complementary bit line;
a second memory cell of the plurality of memory cells in a second column of the columns is coupled to a second bit line pair comprising the first complementary bit line used as a second bit line and a second complementary bit line; and
a programming pattern of memory cells of a column from the columns is reversed based on a programming pattern of memory cells in a preceding column from the columns.

* * * * *

UNITED STATES PATENT AND TRADEMARK OFFICE
CERTIFICATE OF CORRECTION

| | | |
|---|---|---|
| PATENT NO. | : 8,605,480 B2 | Page 1 of 1 |
| APPLICATION NO. | : 13/178856 | |
| DATED | : December 10, 2013 | |
| INVENTOR(S) | : Nitin Jain et al. | |

It is certified that error appears in the above-identified patent and that said Letters Patent is hereby corrected as shown below:

On the Title page, item (54) and in the Specification, Col. 1, line 1, title should read:

READ ONLY MEMORY DEVICE WITH COMPLEMENTARY BIT LINE PAIR

Signed and Sealed this
Eleventh Day of March, 2014

Michelle K. Lee
*Deputy Director of the United States Patent and Trademark Office*